United States Patent
Elrod et al.

(10) Patent No.: US 7,347,533 B2
(45) Date of Patent: Mar. 25, 2008

(54) LOW COST PIEZO PRINTHEAD BASED ON MICROFLUIDICS IN PRINTED CIRCUIT BOARD AND SCREEN-PRINTED PIEZOELECTRICS

(75) Inventors: Scott A. Elrod, La Honda, CA (US);
John S. Fitch, Los Altos, CA (US);
David K. Biegelsen, Portola Valley, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 273 days.

(21) Appl. No.: 11/017,471

(22) Filed: Dec. 20, 2004

(65) Prior Publication Data

US 2006/0132543 A1    Jun. 22, 2006

(51) Int. Cl.
*B41J 2/14* (2006.01)
*B41J 2/16* (2006.01)

(52) U.S. Cl. .......................................... 347/50; 347/58
(58) Field of Classification Search ................. 347/20, 347/45, 47, 68, 70, 71, 93, 72, 92, 50, 56–59
See application file for complete search history.

(56) References Cited

U.S. PATENT DOCUMENTS

| | | | |
|---|---|---|---|
| 4,110,140 A | 8/1978 | Laakaniemi et al. | 156/87 |
| 4,188,977 A | 2/1980 | Laakaniemi et al. | 137/833 |
| 4,285,779 A | 8/1981 | Shiga et al. | 205/73 |
| 4,883,219 A | 11/1989 | Anderson et al. | 228/190 |
| 5,087,930 A | 2/1992 | Roy et al. | 347/85 |
| 5,489,930 A * | 2/1996 | Anderson | 347/71 |
| 6,322,206 B1 | 11/2001 | Boyd et al. | 347/85 |

(Continued)

FOREIGN PATENT DOCUMENTS

WO    WO 01/42020 A1    6/2001

(Continued)

OTHER PUBLICATIONS

Fluidic Microsystems Base on Printed Circuit Board Technology, Ansgar Wego, Stefan Richter and Lienhard Pagel, Institute of Physics Publishing, Journal of Micromechanics and Microengineering, Published Jul. 19, 2001 (pp. 528-531).*

(Continued)

*Primary Examiner*—Juanita D. Stephens
(74) *Attorney, Agent, or Firm*—Fay Sharpe LLP

(57) ABSTRACT

In accordance with one aspect of the present exemplary embodiment, a printhead includes a printed circuit board having at least one base layer, with at least one electrical trace, at least one fluidic passage and at least one fluidic chamber as part of the printed circuit board. The at least one electrical trace, fluidic passage and fluidic chamber are formed using printed circuit board manufacturing processes. An integrated circuit control chip is attached to the printed circuit board using known printed circuit board techniques. At least one fluidic actuator arrangement and aperture plate are attached to the printed circuit board using known PCB attachment processes.

17 Claims, 7 Drawing Sheets

U.S. PATENT DOCUMENTS

| | | | |
|---|---|---|---|
| 6,341,845 B1 | 1/2002 | Scheffelin et al. | 347/50 |
| 6,361,146 B1 * | 3/2002 | Saldanha Singh et al. | 347/71 |
| 6,454,260 B1 | 9/2002 | Noolandi et al. | 273/108 |
| 6,523,940 B2 | 2/2003 | Scheffelin et al. | 347/50 |
| 6,548,895 B1 | 4/2003 | Benavides et al. | 257/2 |
| 6,552,901 B2 | 4/2003 | Hildebrandt | 361/700 |
| 6,565,193 B1 | 5/2003 | Silverbrook et al. | 347/50 |
| 6,767,079 B1 | 7/2004 | Moore | 347/49 |
| 6,786,708 B2 | 9/2004 | Brown et al. | 417/413.3 |
| 2002/0041486 A1 | 4/2002 | Hildebrandt | 361/700 |
| 2004/0013545 A1 | 1/2004 | Brown et al. | 417/413.3 |
| 2004/0135849 A1 | 7/2004 | Moore | 347/50 |
| 2004/0179063 A1 | 9/2004 | Silverbrook et al. | 349/42 |

FOREIGN PATENT DOCUMENTS

WO    WO 2004/017688 A1    2/2004

OTHER PUBLICATIONS

Precision Alignment Packaging for Microsystems with Multiple Fluid Connections, Paul Galambos, Gilbert L. Benavides, Murat Okandan, Mark W. Jenkins and Dale Hetherington, Proceedingsof 2001 ASME: International Mechanical Engineering Conference and Exposition, Nov. 11-16, 2001, New York, NY (8 pgs.).

Fluidic Microsystems Based on Printed Circuit Board Technology, Ansgar Wego, Stefan Richter and Lienhard Pagel, Institute of Physics Publishing, Journal of Micromechanics and Microengineering, Published Jul. 19, 2001 (pp. 528-531).

An Engineering Process Makes For Better Printed Circuit Board Designs by Randal L. Torgerson, Avanthon Engineering, Inc, Copyright 2002 Avanthon Engineering, Inc. (16 pgs.).

* cited by examiner

US 7,347,533 B2

LOW COST PIEZO PRINTHEAD BASED ON MICROFLUIDICS IN PRINTED CIRCUIT BOARD AND SCREEN-PRINTED PIEZOELECTRICS

BACKGROUND

The present application relates to printheads and methods of making printheads and more particularly to employing manufacturing concepts for low cost printhead production.

Ink jet printheads, and in particular drop-on-demand ink jet printheads, are well known in the art. The principle behind an piezo ink jet printhead is the displacement of an ink chamber and subsequent emission of ink droplets from the ink chamber through a nozzle. A driver mechanism is used to displace the ink in the ink chamber. The driver mechanism typically consists of a transducer (e.g., a piezoelectric component) bonded to a thin diaphragm. When a voltage is applied to a transducer, the transducer attempts to change its planar dimensions, but, because it is securely and rigidly attached to the diaphragm, bending occurs. This bending displaces ink in the ink chamber, causing the flow of ink both through an inlet from the ink supply to the ink chamber and through an outlet and passageway to a nozzle. In general, it is desirable to employ a printhead geometry that permits multiple nozzles to be positioned in a densely packed array. However, the arrangement of ink chambers and coupling of ink chambers to associated nozzles is not a straight forward task, especially when compact ink jet array printheads are sought.

The printing industry is continually seeking to decrease the cost of printing systems and to improve the printing quality. In order for piezoelectric inkjet printing devices to remain competitive, for example in markets currently addressed by xerography, the cost for such printheads need to decrease.

While various cost saving approaches have been addressed, many steps of printhead manufacturing employs procedures specifically designed for such devices and use labor intensive and costly processes.

An example of an existing drop on demand ink jet printhead is taught by U.S. Pat. No. 5,087,930. This patent was designed to enhance the packing density of the pressure chambers, ink supply channels leading to the pressure chambers and offset channels in the printhead. However, as can be seen, the printhead is formed using specific manufacturing processes for the printhead including diffusion bonding and braising. A drawback of this manufacturing system as well as others is the requirement of using processes that are formed specifically for the printhead industry. Since such processes are designed specifically for the printhead industry, only a relatively small number of companies and/or persons have the expertise to manufacture the printheads. It is therefore worthwhile to use technology that has a wider base of use and/or infrastructure for the manufacture of printheads resulting in an increased cost savings.

SUMMARY

In accordance with one aspect of the present exemplary embodiment, a printhead includes a printed circuit board having at least one base layer, with at least electrical trace, at least one fluidic passage and at least one fluidic chamber as part of the printed circuit board. The electrical trace, fluidic passage and fluidic chamber are all formed using printed circuit board manufacturing processes. An integrated circuit control chip is attached to the printed circuit board using known printed circuit board techniques. At least one fluidic actuator arrangement and aperture plate are attached to the printed circuit board using known PCB attachment processes.

DETAILED DESCRIPTION

Figure 1:
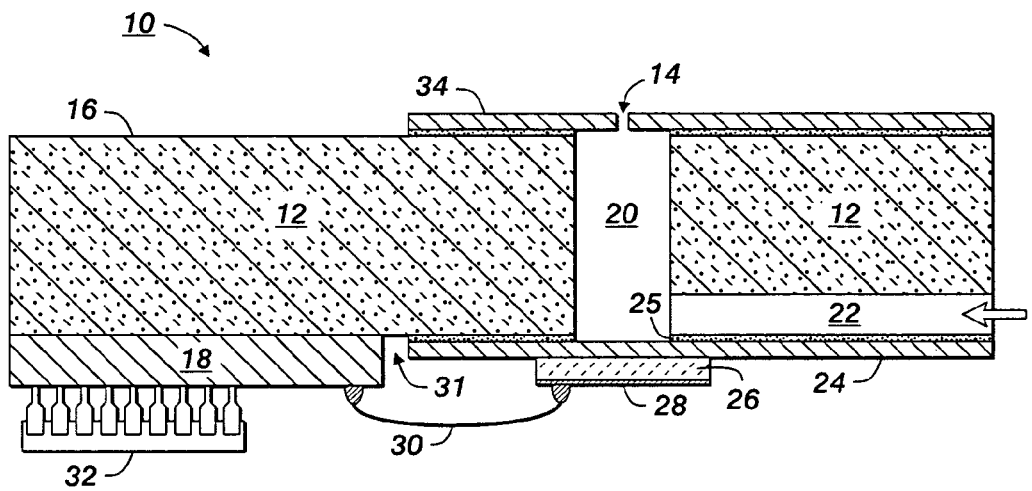
FIG. 1 is a block diagram of a printhead embodied on a printed circuit board.

Referring to FIG. 1, illustrated is a simplified diagram of a printhead formed entirely on printed circuit board (PCB) employing known printed circuit board processes. The concept employs known printed circuit board (PCB) manufacturing procedures and known PBC materials to build low cost printheads which incorporate the entire or substantial parts of a printhead directly on the PCB.

Printed circuit boards are known to carry electronic circuits formed by mounting electronic components on a non-conductive substrate, and creating conductive connections between them. The creation of the circuit patterns is accomplished by using both additive and subtractive methods. The conductive circuit is generally copper, although aluminum, nickel, chrome and other metals or conductors may also be used. There are three basic varieties of printed circuit boards including single-sided, double-sided, and multi-layered. The spatial and density requirement and circuitry complexity determine the type of board produced.

Production of printed circuit boards involve the plating and selective etching of flat metal circuits supported on a non-conductive substrate/base, such as a sheet of plastic. Production begins with a sheet of plastic laminated with a thin layer of copper foil. Holes (such as vias) are drilled through the board using an automated drilling machine or other hole-making device including for example, lasers. Holes are used to mount electronic components in the board and to provide a conductive circuit from one layer of the board to another. Following the drilling, the board is cleaned and etched to promote good adhesion and is then plated with an additional layer of metal. Since the holes are not conductive, electroless metal plating may be employed to provide a thin continuous conductive layer over the surface of the board and through the holes. Following plating, a plating resist is applied and photo-imaging or patterning is used to create the circuit design. Metal may then be electroplated on the board to its final thickness. A thin layer of tin lead solder or pure tin is plated over the metal as an etch resist. The plating resist is removed to expose the metal not part of the final circuit pattern. The exposed metal is removed by etching to review the circuit pattern.

As discussed in the article Fluidic Microsystems Based on Printed Circuit Board Technology, J. Micromech. Microeng. 11 (2001) 528-531, Wego, Richter and Pagel, utilization of manufacturing principles of printed circuit boards (PCBs) as, for example, described above, has been suggested to form fluidic microsystems. It is stated therein that the basic idea of PCB-based fluidic systems is to modify the well-known multi-layer technology utilizing conventional, copper plated rigid base metal (e.g., FR4). To create fluidic channels, the PCB is structured (e.g., by chemical wet etching) forming the lateral borders of a channel. By stacking one structured PCB upon another the channel is created.

Turning to FIG. 1, shown is a simplified cross-section (not to scale) for a printhead 10 fully incorporated on a printed circuit board (PCB) 12. Printhead 10 is constructed using either the above-noted series of PCB process steps or other well known process steps in the printed circuit board arts. A particular benefit obtained in the manufacture of printhead 10 and the other printhead embodiments disclosed herein, is the use of techniques and processes now commonly being employed within the existing printed circuit board manufacturing infrastructure, which permits for an economically efficient production of the printhead.

The cross-sectional view of printhead 10 shows only a single row of nozzles 14. In this design, PCB substrate 16 may be FR4. However, other materials may also be used including but not limited to g10, other polymer materials, plastics, or ceramics. A conductive circuit or trace 18 is patterned on one surface of substrate 12, using known PCB techniques. A body chamber 20 is drilled, lasered, routed, or otherwise formed within substrate 16 using known PCB manufacturing techniques. An inlet 22 is formed within substrate 16 by etching, routing, lasering, drilling or by other known process. Inlet 22 is formed to provide a passage for delivery of ink to body chamber 20.

An actuator metal layer (e.g. diaphragm) 24, such as a stainless steel plate is adhered to a surface of substrate 16 by any of a number of known PCB techniques including the use of lamination and/or adhesives 25. Actuator metal layer 24 could also take the form of a stainless steel shim that is laminated to the PCB board using conventional PCB techniques. A piezoelectric block 26 is bonded to a surface of metal actuator layer 24 by known attachment processes used in the PCB arts, such as by adhesive 25. Piezoelectric block 26 has electrode 28 on a surface which may be formed in known manners such as depositing electrode material over a large block of piezoelectric material (with an electrode) by either a sawing or lasering, and then picking and placing the smaller piezoelectric block (and electrode 28) on actuator layer 24.

Alternatively, and as described in pending U.S. patent application Ser. Nos. 10/375,975, 10/376,527, and 10/376,544 to Baomin Xu, et al., commonly assigned and each incorporated in its entirety by reference, the piezoelectric may be screen printed onto a carrier substrate such as a sapphire substrate, and fired at high temperature. Then it may be laser released for transfer to another substrate, such as in this case the surface of stainless steel layer 24 of FIG. 1.

The combination of actuator layer 24 with piezoelectric block 26 (with electrode 28), may be considered a driver mechanism or fluid actuator arrangement. An interconnect, such as wire bond 30, is provided between metal tracing 18 and piezoelectric electrode 28, separated by gap 31. It is to be appreciated other interconnect techniques may be employed such as flip chip or, thin film techniques, among others.

A driver chip 32 such as a driver ASIC may be attached to the PCB and powered by a power supply (not shown).

A nozzle (or aperture) layer 34 (with nozzles 14) is fabricated using current techniques known in the nozzle industry. It may be attached to substrate 16 using conventional PCB lamination or other PCB connection techniques. In one embodiment the nozzle layer is made of stainless steel, which may, for example, be laser drilled, chemically etched or electro formed, and then connected to the substrate 16.

Driver chip 32 is used to provide a selectable signal path for actuation of the ejection process. Driver chip 32, can also provide normalization so that each nozzle in a multi-nozzle system will be individually controlled in its timing of operation, when the driver chip switch closes, allowing current to pass to the intended nozzle.

Therefore in operation of printhead 10, when power is supplied to the driver chip 32, and the driver chip closes a switch to provide a path for a signal from metal trace 18 to wire bond 30 and electrode 28, the piezoelectric block 26 will deform applying pressure to diaphragm 24. Movement of diaphragm 24 into the body chamber 20 causes pressure within the chamber and the ejection of fluid through nozzles 14. Body chamber 20 is replenished with fluid (such as ink) by inlet 22. Inlet 22 is connected to an ink supply such as a manifold, ink reserve or other appropriate external ink source.

With further attention to ink inlet 22, in addition to being formed by routing and drilling, it may also be formed by processes also used to form metal traces 18. In this embodiment the surface of substrate 16 is patterned or masked (e.g., photo-patterning) and etched in step similar to that used to form metal traces intended to carry electrical signals. However in this instance, the etching procedures are used to form fluid passages (such as inlet 22).

For printhead 10 of FIG. 1, as well as other printheads formed according to the present disclosure, it may be desirable to passivate the surfaces of the printhead in order to avoid short circuiting or interference of the ink by metal layers on the surface of the printed circuit board. Such passivation may be undertaken by known electro or electroless plating of the metal such as copper, nickel or other metal being used, including using electroless nickel plating to passivate selected metal layers of the printed circuit board. Electrical isolation can be achieved by coating with a dielectric material, including conventional PCB solder mask material, vacuum-deposited parylene or other appropriate isolation material.

Figure 2:
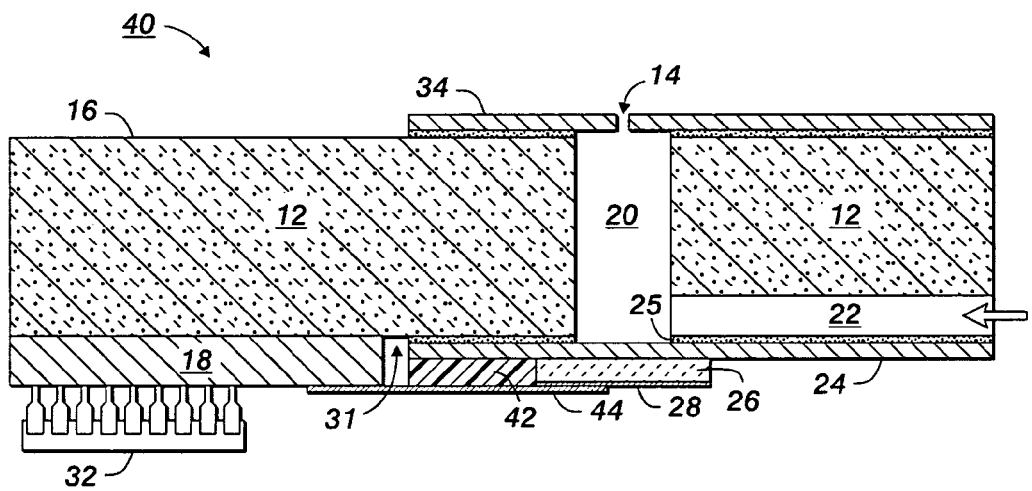
FIG. 2 is an alternative embodiment of the printhead located on a PCB board according to FIG. 1.

Turning to FIG. 2, illustrated is a second embodiment of printhead 40 similar to printhead 10 shown in FIG. 1, however, a distinction between these two embodiments is the thin film design used for the interconnect between metal trace 18 and piezo electrode 28. In this embodiment, first non-conductive layer (e.g., a dielectric) 42 is deposited to insulate diaphragm 24. Thereafter, a metal trace layer is deposited on non-conductive layer 42 permitting metal layer 44 to interconnect metal trace 18 and electrode 28, which are separated by gap 31.

Figure 3:
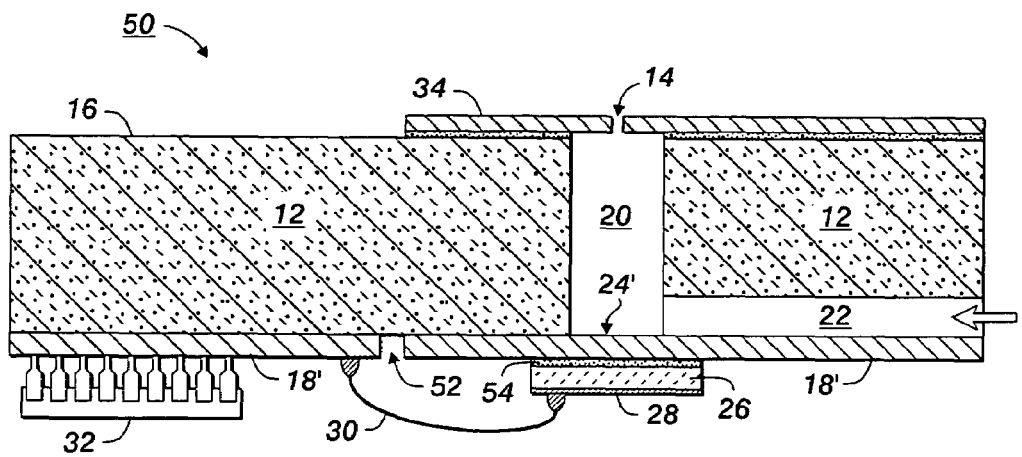
FIG. 3 is a further embodiment of a printed circuit board embodied on a printhead as in previous FIGS. 1 and 2.

Turning to FIG. 3, depicted is another embodiment of printhead 50 configured on printed circuit board 12. In this embodiment, diaphragm 24 of FIGS. 1 and 2 is removed, and copper trace 18' is patterned in a manner wherein copper trace 18' extends across body chamber 20. By this design, a portion of metal trace 18' is used to function as active metal layer (diaphragm) 24' previously accomplished by layer 24. Active metal layer area (diaphragm) 24' is separated from a portion of metal trace 18' by gap 52, which is formed in metal trace 18 at a position between the ends of the wirebond attachment 30, for electrical isolation. A connection layer 54 located between piezoelectric material 26 and diaphragm 24' of metal trace 18' includes a non-conductive material such as a non-conductive adhesive. The design of FIG. 3 emphasizes that the diaphragm can be configured from the metal trace material. It is understood that when the metal layer is made of a thickness sufficient for the diaphragm, it should be thick enough for electrons. Therefore, the metal trace and the diaphragm can be configured in the same manufacturing step. This distinguishes the design of FIG. 3, from that of FIG. 1, where the metal trace 18 is developed in a process separate from the process for diaphragm 24, where these elements are shown in different thicknesses to emphasize that they are different layers.

It is to be noted that aspects of each of the embodiments of FIGS. 1-3 may also be included in other discussed embodiments. For example, thin film layer interconnect 44 of FIG. 2 may be used in the embodiment of FIG. 3 in place of the wire bond interconnect 30.

Inlet 22 is sized so its impedance at the frequency of ejection is sufficient to block backward flow into a reservoir (not shown) of fluid. Therefore, the sizing of inlet 22 is used to control the channel flow.

The embodiments of FIGS. 1-3 show a single row of ink injectors. However in many instances it is desirable to include a large number of compact ink injectors on a single printhead to improve the efficiency and value of the printhead. In particular, the more ink jets or nozzles on a printhead the greater the possibility of using the ink jet printhead as a color printer, and/or as a high resolution printer. Consider for example an ink jet printhead used in a typewriter-like print engine in which the print medium is advanced vertically on a curved surface past a printhead which prints boustrophedon, that is which shuttles back and forth and prints in both directions during shuttling. In such a case, it is desirable to provide a printhead with an array of nozzles which span the minimum possible vertical distance so that the variation of distance to print medium for the various nozzles is at a minimum.

In order to obtain a more compact printhead formed on a PCB, multi-layers are attached to each other permitting for the offset of nozzles and of inlets or ink passageways within the printhead. More particularly, by having the multi-layers, it is possible to create multiple passageways for the supply of fluid such as ink to the nozzles, giving a greater degree of freedom than possible in a printhead created of a single printed circuit board.

Figure 4:
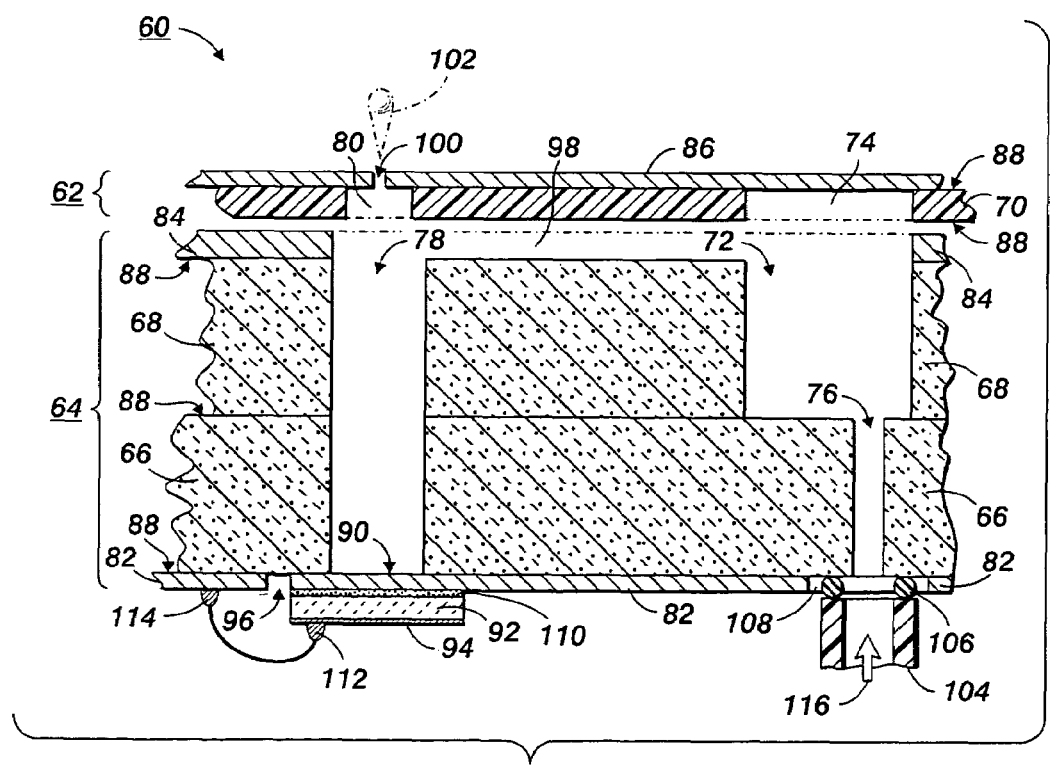
FIG. 4 shows a multi-layered printed circuit board first sub-assembly and second sub-assembly which are to be joined together.

Turning to FIG. 4, shown is a printhead embodied in a multi-layer printed circuit board arrangement. This design illustrates that passages can be created in the various layers of the PCB.

With more particular attention to FIG. 4, multi-layered printhead 60 is shown with upper sub-assembly 62 and lower sub-assembly 64, each formed on separate PCB substrates. It is to be understood that sub-assemblies 62, 64 are subsequently joined to create multi-layered printhead 60. Lower sub-assembly 64 includes two substrates (bases) 66 and 68, formed of FR4 or other known base material used in print circuit boards such as g10, polymer, materials, plastics, or ceramics, among others. Upper sub-assembly 62 also includes base layer 70 similar to bases 66 and 68. Lateral cuts 72, 74 are provided in bases 68, 70. Such lateral cuts may be made by lasering, routing, milling or other known PCB processes. Also included in base layers 66, 68 and 70 are vias (holes) such as vias 76, 78 and 80. These vias can be formed by normal PCB drilling or lasering techniques. Metal layers 82 and 84 are shown joined to base layers 66 and 68, using adhesive 88. Diaphragm 90 is formed of metal on the lower side of a base 66. It is to be noted that diaphragm 90 may be formed from metal layer material 82. A piezoelectric block 92 has an electrode 94 on one surface.

The metal traces may also be used to form fluidic passages, such as passage 98, which connect a fluidic header or manifold formed by lateral cuts 72 and 74. Fluidic passage 98 connects the fluidic header or manifold (72, 74) to the via (e.g., blind via) 78, which forms an ink jet compression chamber.

Metal aperture layer 86 is joined to base 70 by adhesive 88. An aperture hole 100 is shown in layer 86. It is noted, aperture layer 86 could first be attached and thereafter a via or hole made using a process such as a drilling or lasering. Ink will emit from hole 100 as ink droplet 102. The ink is supplied to the printhead via a fitting or other manifold part 104 which is connected to the printhead via a seal such as an O-ring or an epoxy joint 106. The vias may be a fill hole which has the metal around it etched back from the seal area 108 so it does not communicate with the fluid or ink. Adhesive 88 is sufficiently thick and of appropriate properties such that it does not allow electrical connection to the ink. In one embodiment, the connection between piezoelectric block 92 and diaphragm 90 is made by an epoxy or other adhesive 110.

Electrical connections to metal layer 82 and piezoelectric electrode 94 can be made by electrical connections 112, 114 which is accomplished by wire bonds, spring contacts, thin film or other compliant connections. For isolation, metal layer 82 is interrupted by a gap 96 between the point of the wire bond attachment, and the portion of layer 82 that runs under the piezo 94. The former would be the energized signal trace, while the latter would be a ground plane. In this embodiment, the control electronics, such as driver chip 32 of FIGS. 1-3 may be located external to printhead 60.

With continuing attention to FIG. 4, sub-assemblies 62, 64 may be bonded together using an adhesive 88 which may be the same adhesive as previously mentioned, or other appropriate material. Thereafter, this multi-layer printhead 60 is filled with ink through channel 116 and then activated to emit ink droplet 102.

The printhead of FIG. 4 is provided only as an example, and additional base layers and/or metal layers may be added or taken away as required for the creation of appropriate passages or functions for a particular printhead design. Thus, layers in the design may not be needed, and additional layers may be used dependent upon the design features.

For example, and not intended to be limiting, an additional metal layer may be added on top of metal layer 84, to facilitate more passages or functions. Alternatively, layer 70 itself may not be needed and layer 86 could be bonded straight to layer 84. Still further lateral cut 74 may not be needed as lateral cut 72 may be sufficient.

Figure 5:
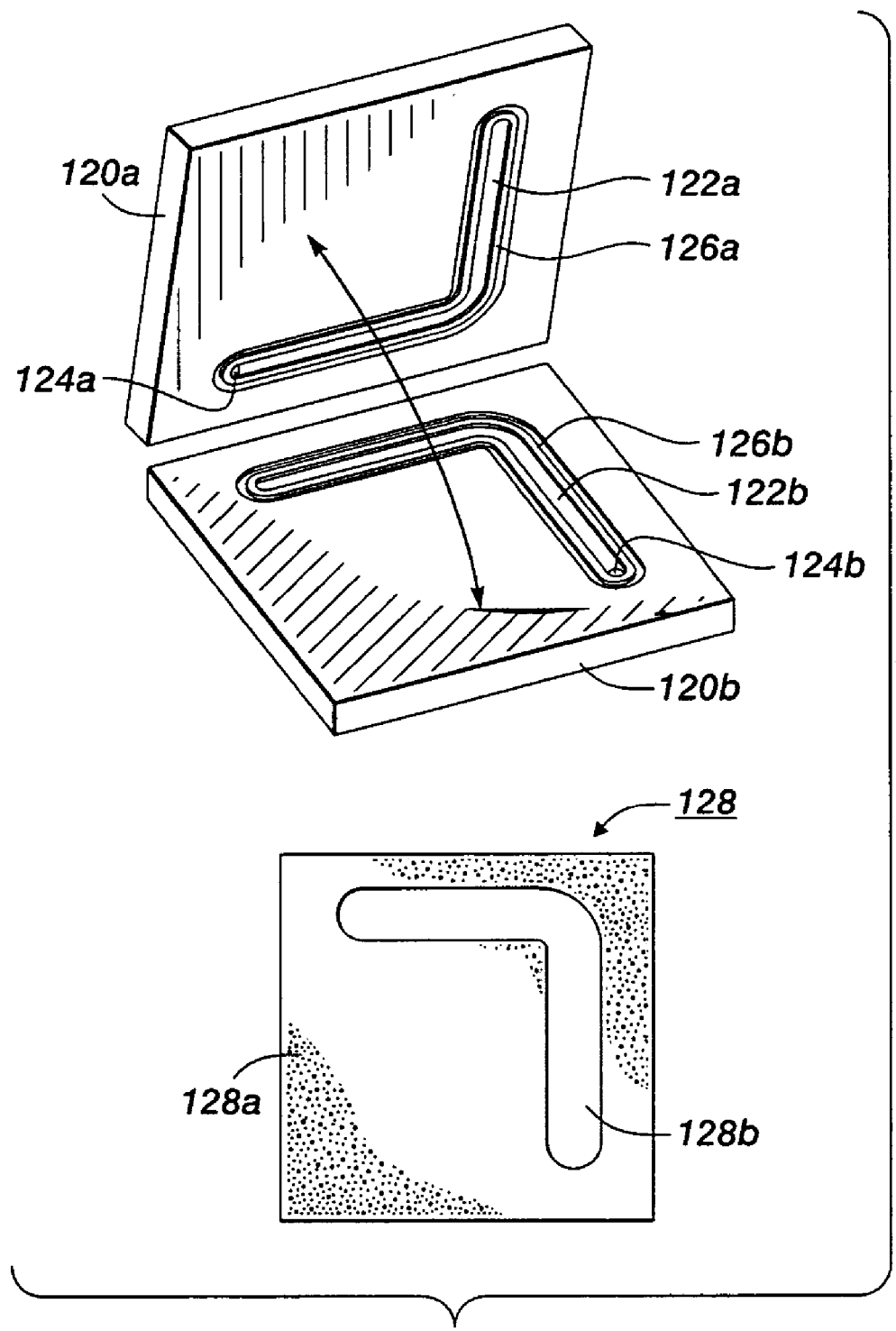
FIG. 5 shows a fluidic passageway being formed by two base layers for a multi-layered printed circuit board and an adhesive layer for connecting the two printed circuit board bases or substrates.

Turning to FIG. 5, illustrated is a simple figure showing one design of fluidic microsystems passages based on printed circuit board technology. A first printed circuit board 120a and a second circuit board 120b are shown. To provide interior fluidic channels for the multi-layered PCB printhead, well-known multi-layered technologies for printed circuit boards are modified using conventional double-sided metal (e.g., copper) plated rigid base materials (such as FR4) as the printed circuit board base material. To create the fluidic channels, in one embodiment, the metal of the PCB is structured (e.g., by chemical wet etching) forming the lateral borders of the channel. As shown in first printed circuit board 120a, fluidic channel 122a, and fluidic via 124a are defined within structured metal 126a. On second printed circuit board base 120b, fluidic channel 122b and fluidic via 124b are formed within structured metal 126b. By stacking printed circuit board 120a and printed circuit board 120b together, an interior fluidic channel within the multi-layered printed circuit board is formed. As also shown in FIG. 5 a sheet of adhesive 128 may be formed with adhesive 128a and cutout portion 128b. Adhesive sheet 128 is placed between PCB bases 120a and 120b prior to their being brought together. In this embodiment seepage of adhesive into the formed fluidic channel is minimized.

Figure 6A:
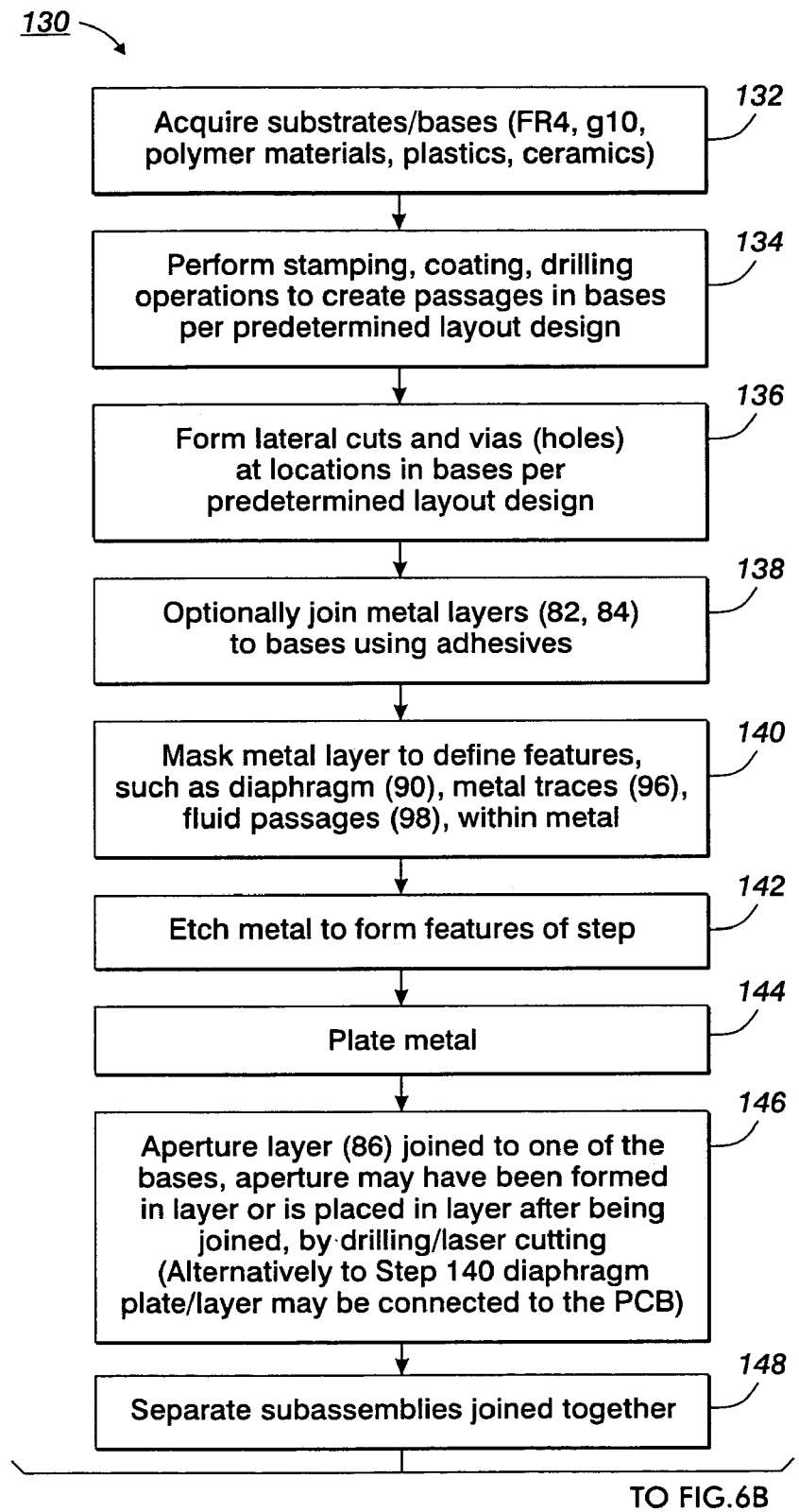
FIGS. 6A-6B show a flow chart depicting a process for the manufacture of a multi-layered printed circuit board.
Figure 6B:
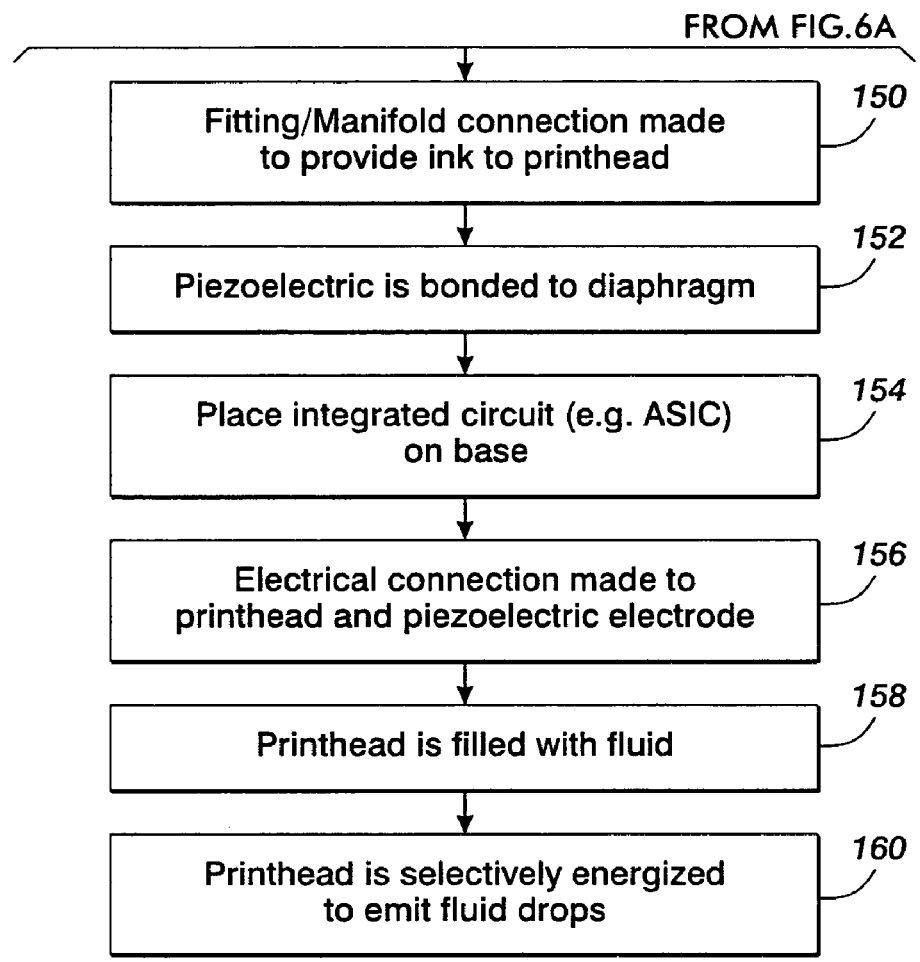

Turning to FIGS. 6A-6B, illustrated is a flow diagram for the manufacture of a multi-layer printed circuit board as shown in FIG. 4.

In FIGS. 6A-6B flow diagram 130 begins the process with blank substrates/bases (e.g., 66, 68, 70 of FIG. 4) such as FR4, g10, polymer materials, plastics, ceramics or other appropriate base material used for the production of printed circuit boards (step 132).

These blank bases are then stamped, routed, drilled, milled, etched or otherwise processed to create passages in conformance with a predetermined circuit board layout. Eventually, a variety of these passages become the fluidic passages of the printhead (step 134). Openings in the base are created through lateral cuts which form comparatively large openings, while other areas in the layers may include vias (holes) such as tent vias, through-hole vias, and blind vias (step 136). The creation of these lateral cuts and vias are common in printed circuit board manufacture, and may be made by known techniques. Some of the bases may then be connected together using known PCB techniques.

Next, metal layers are joined to the bases using an adhesive process. The adhesives may be any known or developed appropriate adhesive used in the printed circuit board industry (step 138). The joined metal is then masked to define features such as diaphragms and metal traces which are used to carry electrical signals on the multi-layered circuit board. The masking of the metal may also be used to define fluidic passages used to connect the fluidic headers or manifolds to an ink jet compression chamber (as described in FIG. 4) (step 140). Following the masking, a PCB metal etching process is undertaken, where the features of the metal layers of the circuit board are defined (step 142). Next, the etched metal is plated (e.g., by electroless plating, or other appropriate technique) to coat all appropriate wetted surfaces (step 144). Thereafter, the aperture layer is joined to one of the base layers in step 146. It is to be noted that an aperture in the aperture layer may already have been formed in the layer. In an alternative embodiment, the aperture layer may be joined by the use of adhesive to a base layer, and thereafter an aperture is formed using a drilling, laser or other hole forming process.

In step 148 two sub-assemblies (as shown in FIG. 4) are bonded together using an adhesive material as is known in the PCB art.

Ink may be supplied by a connection such as a fitting or other manifold part where a seal such as an O-ring or epoxy connects the manifold part to the printed circuit board (step 150). The metal around the fill hole (as described in connection with FIG. 4) is etched back from the seal area so that it is not in communication with the ink. Thereafter, a transducer (e.g., piezoelectric) is bonded to the diaphragm by an adhesive which is placed between the piezoelectric and the diaphragm layer (step 152). An appropriate integrated circuit such as an ASIC controller is attached to the PCB (step 154), and electrical connections are made between the integrated circuit and the piezoelectric such that the piezoelectric may be selectively powered (step 156).

Thereafter, a fluid is filled into the printhead (step 158) and the printhead may be energized to generate droplets (step 160).

By the above outlined processes, a multi-layered printed circuit board printhead is formed. Thus, by modifying well known multi-layer PCB technology utilizing conventional double-sided plated rigid base materials, it is possible to form a printhead with fluidic chambers, fluidic passages, electrical connections, nozzles and control on the multi-layered PCB. It is to be appreciated the forgoing order of steps may be altered and additional steps added or existing steps eliminated depending on the printhead being manufactured.

With further attention to the formation of the fluidic channels, a particular issue is to ensure that the adhesive between the multi-layers does not interfere with the interior of the fluidic channels. One embodiment has been discussed in connection with FIG. 5, where a sheet or layer of pre-cut adhesive is used.

Another procedure is suggested in the article, Fluidic Microsystems Based On Printed Circuit Board Technology, Institute of Physics Publishing J. Micromech. Microeng., 11 (2001) 528-531". In this process a single board dipped in an adhesive liquid of a certain viscosity (epoxy resin solved in ethanol, the viscosity approximately equals 3-7 mPa s) and coated with a thin uniform adhesive film (2-6 μm) by pulling them out of the solution with a constant velocity. Subsequently, the adhesive is cured under the application of temperature and pressure. This technique is described as ensuring a tight connection of the PCBs and will maintain the fluidic functionality of the channels without reducing the channel height significantly (2-6 μm).

In another embodiment the fluidic passages may be defined by the base material (e.g., FR4) being located on all sides so there would not be any patterned copper or other metal within the interior of the fluidic passage. Particularly, the base material may be milled or routed using an end mill router or laser to form a particular side of the passage. Then when the pieces are brought together (i.e., the individual base layers of the multi-layer circuit board) the passage will be defined only by the base layer material by this process, the adhesive (e.g., epoxy) issue is still relevant, but there will not be wetted metal such as copper to address. So in this case, instead of the passage being a place where the metal is etched away, the milling, routing, etc. operations will provide an indentation within the base without the etching process being necessary.

In some embodiments certain high value custom printhead layers such as the top layer of stainless steel (e.g., the aperture layer), and the bottom layer of stainless steel (e.g., the diaphragm) may be processed separately from the PCB processes and laminated to the circuit board. These stainless steel layers may be laser drilled, chemical etched, electro formed or manufactured by other known processes and then bonded to the nearly complete printed circuit board structure.

Figure 7:
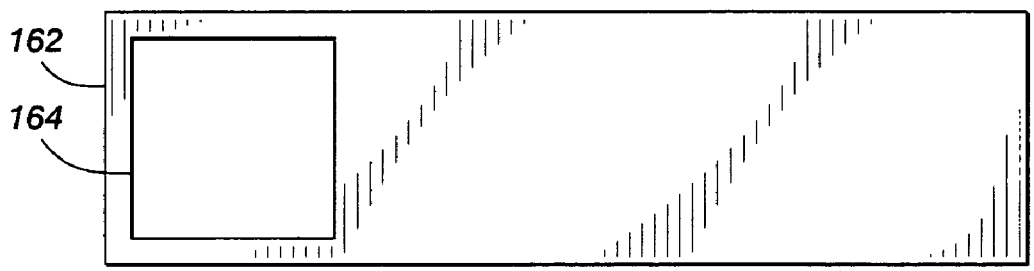
FIG. 7 shows a picture frame layer for positioning of a transducer on a printed circuit board.

Turning to FIG. 7, shown is frame layer 162 which may be incorporated into the printheads. In this embodiment, frame layer 162 is added to locate the piezoelectric block being bonded to diaphragm 90. As can be seen, frame layer 162 includes frame opening 164 which acts similar to a picture frame, to appropriately position the piezoelectric block. Following the attachment or bonding of the piezoelectric block, frame layer 162 may, optionally, be removed.

Figure 8:
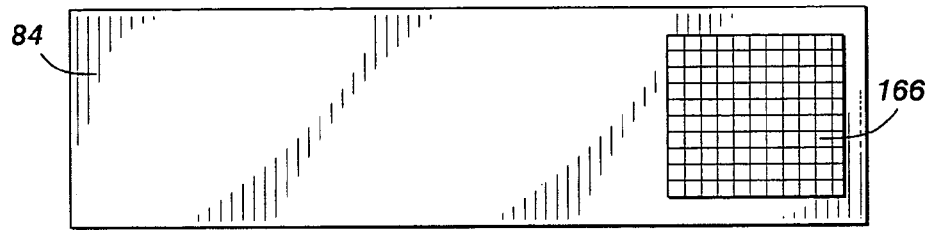
FIG. 8 includes an ink filter within a layer of the printed circuit board.

Turning to FIG. 8, in still a further embodiment of the device of FIG. 4, metal layer 84 shown in top view, may be designed to include filter screen 166 by laser cutting or etching fine holes at a position in layer 84 such that when included in the printhead stack, filter screen 164 is located by the fluid passages to filter the ink flow. Thus, in this embodiment instead of simply etching away an area, a fluid screen would be configured. Alternatively, a filter 166 such as shown in FIG. 8 may be developed as a separate entity and placed within the printhead stack of bonded components.

Figure 9:
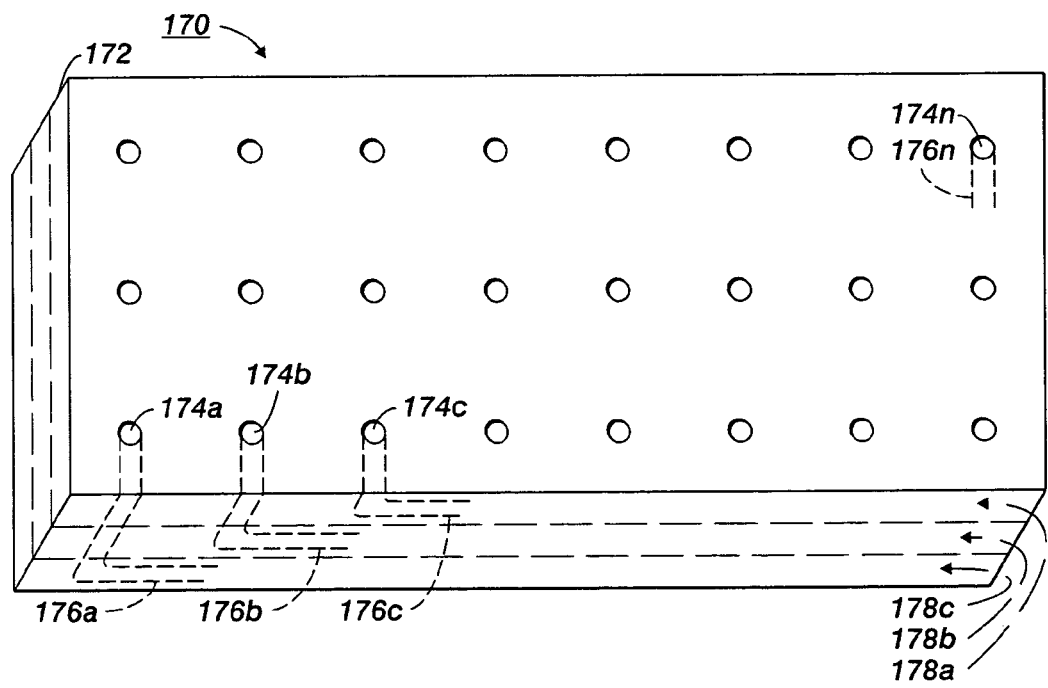
FIG. 9 shows fluidic passageways routed within a multi-layered printed circuit board; and, FIG. 10 depicts a further embodiment of the multi-layered printed circuit board showing input and output ports as well as a vent port.

Turning now to FIG. 9, illustrated is a top view of printhead 170 formed on multi-layered circuit board 172 having a plurality of nozzles 174a-174n. The nozzles are formed to connect with corresponding fluidic passages (176a-176n) which provide fluid to particular nozzles.

The printhead of FIG. 8, is provided to illustrate the concept of providing fluid passages in varying layers of multi-layered PCB printhead 170. For example, nozzle 174a is connected to fluidic passageway 176a which extends through PCB layers 178a, 178b, and then extends in layer 178c. Nozzle 174b is in operative connection with fluidic passageway 176b which passes through PCB layer 178 and then is shown to extend in PCB layer 178b. Nozzle 174c is shown in operative connection to fluidic passageway 176c which moves into layer 178a and then extends within this layer. The foregoing is intended to show that each of the printheads of the array shown in FIG. 8 may be connected to fluidic passages which are formed in various layers of a multi-layer printed circuit board. It is to be understood that these passages are not shown to their final destination which would be an ink inlet, manifold or other type of reservoir. However, the concept intended to be shown here is that these fluidic passageways may be developed in different layers of a multi-layered printed circuit board. While the metal tracings providing electrical connections are not shown to simplify the discussion, they will also extend through various layers of PCB as required to energize diaphragms (not shown).

An integrated circuit chip such as an ASIC may be attached on multi-layered PCB 170 whereby all components of the printhead are located on the printed circuit board. However, this diagram is also intended to show that at least some components of the printhead do not need to be on the printed circuit board. For example, the ASIC may be located external to the board and simply electrical connection lines would be provided to send the required signals for appropriate droplet ejection.

Figure 10:
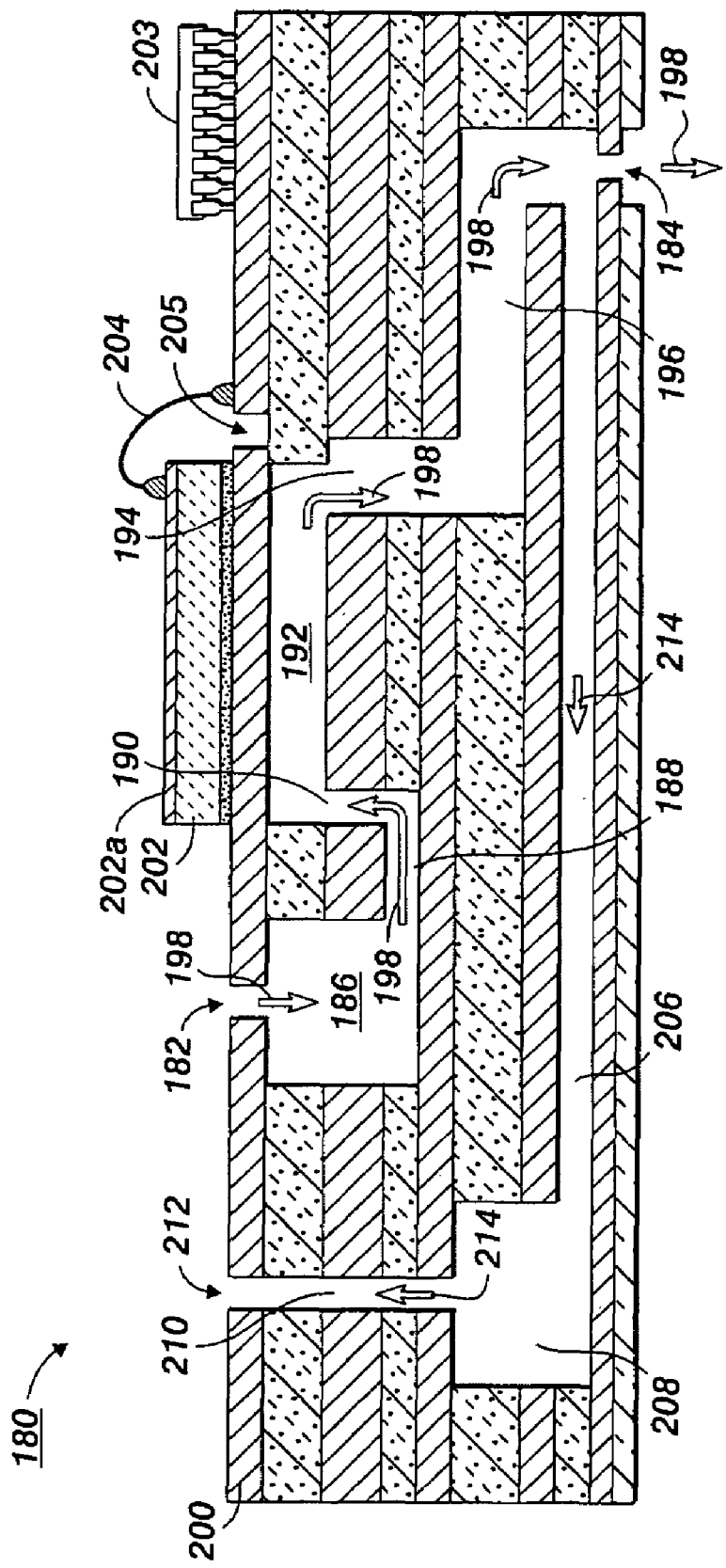

Turning to FIG. 10, illustrated is another embodiment of a printhead 180 embodied on a multi-layered printed circuit board. Printhead 180 includes ink inlet 182 through which ink is delivered to the ink jet printhead. The body also defines ink drop forming orifice outlet or nozzle 184 together with ink flow path from ink inlet 182 to the nozzle. In general, the ink jet printhead of the present embodiment preferably includes array of nozzles 184 which are proximately disposed, that is closely spaced from one another.

Ink entering ink inlet 182 flows into ink supply manifold 186. A typical ink jet printhead of this type has at least four such manifolds for receiving, respectively, black, cyan, magenta, and yellow ink for use in black plus three color subtraction printing. However, the number of such manifolds may be varied depending upon whether a printer is designed to print solely in black ink or with less than a full range of color. From ink supply manifold 186, ink flows through ink supply channel 188, through ink inlet 190 and into ink pressure chamber 192. Ink leaves pressure chamber 192 by way of ink pressure chamber outlet 194 and flows through ink passage 196 to nozzle 184 from which ink drops are ejected. Arrows 198 diagram this ink flow path.

Ink pressure chamber 192 is bounded on one side by metal trace 200 which includes an area acting as a flexible diaphragm 200'. The pressure transducer in this case is piezoelectric block 202 secured in a manner as described in previous embodiments. Piezoelectric block 202 includes metal film layer (electrode) 202a to which an integrated electronic circuit drive (e.g., an ASIC 203), is electrically connected by connector arrangement 204. The ASIC 203 is electrically connected to metal trace 200, wherein metal trace 200 has a gap portion 205 for electrical isolation. Application of power by a power source (not shown) causes a bending in piezoelectric block 202 which displaces ink in ink chamber 192. Refill of ink chamber 192 following the ejection of an link drop can be augmented by reverse bending of piezoelectric block 202. As shown in FIG. 10, piezoelectric block 202 is mounted on layer 200. It is to be understood that the electrical drive signal can be supplied to the bottom side of block 202, and the ground connection may be made to 202a.

In addition to main ink flow path 198 described above, optional ink outlet or purging channel 206 is also defined. The purging channel 206 is coupled to the ink passage 196 at a location adjacent to but interior of nozzles 184. The purging channel communicates from passage 196 to outlet or purging manifold 208 which is connected by outlet passage 210 to purging control outlet port 212. The manifold 208 is typically connected by similar purging channels 206 to the passages associated with multiple nozles. During this purging operation, ink flows in a direction indicated by arrows 214 through purging channel 206, manifold 208 and purging passage 210.

As described in the previous embodiments, the various interior fluidic passages are formed using the previously-discussed PCB techniques of routing, milling, laser cutting, drilling as well as etching of metal traces such as copper traces. Thus, the copper traces may be used for electrical connection as described as well as the formation of fluidic channels. As can be seen in this embodiment, there are multiple PCB substrate layers in which the passages as well as metal tracings are formed. The combination of the layers or bonding of the layers occurs as in the previous embodiments including the appropriate PCB adhesives and other bonding procedures well known in the PCB arts. Thus, FIG. 10 is provided to show the possibility of having a plurality of base layers to form a multi-layered PCB printhead. It is again also to be appreciated that while this is shown in cross-section, by having the multiple layers with the degrees of freedom that entails, a large number of staggered drop ejection nozzles may be combined into a single PCB printhead.

As stated above, while a cross-section of this figure is shown, multiple nozzles are provided with the liquid passageways formed within the printed circuit board as discussed in the previous embodiments.

While the foregoing description has primarily discussed ejection of ink and ink printing, the described devices and methods may be used for applications other than ink printing, such as for use in the areas of biology, combinatorial chemistry, as well as other areas, for ejection of biofluids or combinatorial materials. Thus, the foregoing is not limited to image or document printing.

Although the present concepts have been described herein with reference to specific embodiments, many modifications and variations therein will readily occur to those skilled in the art. Accordingly, all such variations and modifications are included within the intended scope of the following claims.

The invention claimed is:

1. A printhead comprising:
at least one printed circuit board having at least one base layer;
at least one electrical trace incorporated into the at least one base layer;
at least one fluidic passage incorporated into the at least one base layer;
at least one fluidic chamber incorporated into the at least one base layer,
wherein the at least one electrical trace, fluidic passage and fluidic chamber are formed using printed circuit board manufacturing processes;
at least one fluidic actuator arrangement connected to a first surface of the printed circuit board;
an aperture plate having at least one nozzle, connected to a second surface of the printed circuit board; and
a control circuit attached to one of the surfaces of the printed circuit board,
wherein the at least one fluidic actuator arrangement, the aperture plate and the control circuit are attached to the printed circuit board using printed circuit board manufacturing processes.

2. The printhead according to claim 1 wherein the printed circuit board is a multi-layered printed circuit board having more than one base layer.

3. The printhead according to claim 2 wherein the at least one fluidic passage is formed in more than one base layer of the base layers of the multi-layered printed circuit board.

4. The printhead according to claim 2 wherein the fluidic passage is an internal fluidic passage, wherein a first base layer is a first portion of the fluidic passage and a second base layer is a second portion of the fluidic passage, and connection of the first base layer and the second base layer defines the internal fluidic passage.

5. The printhead according to claim 4 wherein the first base layer and second base layer are connected together through the use of an adhesive.

6. The printhead according to claim 5 wherein the adhesive is an adhesive sheet with portions cut out to minimize adhesive entering the internal fluidic passage.

7. The printhead according to claim 1 wherein all elements required to eject drops from the printhead are located on the printed circuit board when the printhead has fluid, and an external power source supplies power to the printhead.

8. The printhead according to claim 1 wherein the fluidic actuator arrangement includes at least one diaphragm and piezoelectric block with an electrode, wherein the piezoelectric block is bonded to the diaphragm, and the diaphragm is positioned and attached to the printed circuit board wherein upon activation of the diaphragm, fluid drops are emitted from the at least one nozzle.

9. The printhead according to claim 8 wherein an electrical connection is provided between the electrical trace and the piezoelectric electrode, and the electrical connection is at least one of an insulated thin film connection, a wire bond connection or a flip-chip connection.

10. The printhead according to claim 1 wherein the at least one fluidic passage is formed by etching a metal trace on the printer circuit board, and all sides of the fluidic passage are of metal.

11. The printhead according to claim 1 wherein the at least one fluidic passage is formed within the at least one base layer, and all sides of the fluidic passage is of the base layer material.

12. The printhead according to claim 1 further including a filter screen positioned to filter fluid flowing in the printhead.

13. The printhead according to claim 1 further including a picture frame layer positioned to act as a guide for placement of the piezoelectric block.

14. The printhead according to claim 1, wherein the aperture plate is of a same material as the metal trace.

15. A printed circuit board designed with elements of a printhead formed or carried on the printed circuit board, the printhead comprising:
at least one base layer;
at least one electrical trace incorporated into the at least one base layer;
at least one fluidic passage incorporated into the at least one base layer;
at least one fluidic chamber incorporated into the at least one base layer,
wherein the electrical trace, fluidic passage and fluidic chamber are formed using printed circuit board manufacturing processes;
at least one fluidic actuator arrangement connected to a first surface of the printed circuit board; and
an aperture plate having at least one nozzle, connected to a second surface of the printed circuit board,
wherein the fluidic actuator arrangement and aperture plate are attached to the printed circuit board using printed circuit board manufacturing processes.

16. The printed circuit board according to claim 15 wherein operation of the fluidic actuator arrangement is controlled by an externally located control circuit, connected to the printed circuit board by external connections.

17. The printed circuit board according to claim 15 wherein the printed circuit board is a multi-layered printed circuit board having multiple bases, and the at least one electrical trace, fluidic passage and fluidic chamber are formed in selected ones of the multiple bases.

* * * * *